United States Patent
Shin (10) Patent No.: US 11,216,335 B2
(45) Date of Patent: Jan. 4, 2022

(54) MEMORY SYSTEM AND OPERATION METHOD THEREOF

(71) Applicant: SK hynix Inc., Gyeonggi-do (KR)

(72) Inventor: Won-Gyu Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 119 days.

(21) Appl. No.: 16/683,989

(22) Filed: Nov. 14, 2019

(65) Prior Publication Data

US 2020/0241958 A1 Jul. 30, 2020

(30) Foreign Application Priority Data

Jan. 24, 2019 (KR) .......................... 10-2019-0009054

(51) Int. Cl.
| | |
|---|---|
| *G06F 11/10* | (2006.01) |
| *H03M 13/09* | (2006.01) |
| *G06F 12/02* | (2006.01) |
| *H03M 13/15* | (2006.01) |

(52) U.S. Cl.
CPC ........ *G06F 11/1064* (2013.01); *G06F 11/102* (2013.01); *G06F 11/1004* (2013.01); *G06F 12/0246* (2013.01); *H03M 13/09* (2013.01); *H03M 13/1515* (2013.01); *G06F 2212/7201* (2013.01)

(58) Field of Classification Search
CPC ............. G06F 11/1064; G06F 11/1004; G06F 11/102; G06F 12/0246; G06F 2212/7201; H03M 13/09; H03M 13/1515
USPC ....... 714/763, 766, 768, 769, 770, 773, 782, 714/784, 799, 800, 805
See application file for complete search history.

(56) References Cited

U.S. PATENT DOCUMENTS

| | | | | |
|---|---|---|---|---|
| 5,761,221 A * | 6/1998 | Baat | .................... | G06F 11/1016 714/766 |
| 5,864,440 A * | 1/1999 | Hashimoto | ........ | G11B 27/3027 360/53 |
| 5,958,079 A * | 9/1999 | Yoshimura | .......... | G06F 11/1048 714/766 |
| 6,457,067 B1 * | 9/2002 | Byers | .................... | G11C 29/02 710/3 |
| 6,604,214 B1 * | 8/2003 | Fukushima | ......... | G06F 11/1008 365/185.33 |

(Continued)

FOREIGN PATENT DOCUMENTS

| | | |
|---|---|---|
| KR | 10-2016-0021556 | 2/2016 |
| KR | 10-2016-0021558 | 2/2016 |

*Primary Examiner* — John J Tabone, Jr.
(74) *Attorney, Agent, or Firm* — IP & T Group LLP (57) ABSTRACT

A memory system includes: a first error detection circuit suitable for generating a first error detection code using host data and a host address which are transferred from a host; a second error detection circuit suitable for generating a second error detection code using system data including one or more host data, a logical address corresponding to one or more host addresses, a physical address corresponding to the logical address and one or more first error detection codes; a third error detection code suitable for generating a third error detection code using the system data, the one or more first error detection codes and the second error detection code; and a first memory suitable for storing the system data, the one or more first error detection codes, the second error detection code and the third error detection code.

18 Claims, 5 Drawing Sheets

(56) References Cited

U.S. PATENT DOCUMENTS

| | | | |
|---|---|---|---|
| 7,239,547 B2* | 7/2007 | Suda | G06F 11/1068 365/185.09 |
| 9,189,329 B1* | 11/2015 | Zhu | G06F 11/1012 |
| 9,191,030 B2* | 11/2015 | Sakata | G06F 11/1004 |
| 9,934,841 B1* | 4/2018 | Langhammer | H03K 19/17758 |
| 10,055,282 B1* | 8/2018 | Zhu | G06F 11/1004 |
| 10,469,105 B2* | 11/2019 | Yang | H03M 13/09 |
| 10,884,848 B2* | 1/2021 | Chung | G06F 11/1016 |
| 10,915,398 B2* | 2/2021 | Chung | G06F 3/0619 |
| 2002/0032891 A1* | 3/2002 | Yada | G06F 11/1068 714/766 |
| 2007/0079212 A1* | 4/2007 | Har-Chen | G06F 11/1044 714/758 |
| 2009/0006923 A1* | 1/2009 | Gara | H03M 1/0687 714/758 |
| 2009/0164865 A1* | 6/2009 | Leonard | H03M 13/6575 714/755 |
| 2011/0264852 A1* | 10/2011 | Zhang | G06F 13/1673 711/103 |
| 2011/0271152 A1* | 11/2011 | Hattori | G06F 11/0793 714/53 |
| 2012/0066567 A1* | 3/2012 | Moyer | G06F 11/1076 714/763 |
| 2012/0246542 A1* | 9/2012 | Moyer | G06F 11/1016 714/763 |
| 2012/0278681 A1* | 11/2012 | Moyer | G06F 11/1016 714/763 |
| 2012/0324312 A1* | 12/2012 | Moyer | H03M 13/13 714/763 |
| 2013/0080854 A1* | 3/2013 | Nicholas | G06F 11/1076 714/758 |
| 2017/0170845 A1* | 6/2017 | Cho | H03M 13/09 |
| 2017/0192704 A1* | 7/2017 | Lee | G06F 3/0619 |
| 2017/0242749 A1* | 8/2017 | Park | G11C 11/40611 |
| 2018/0088848 A1* | 3/2018 | Lee | G06F 11/1076 |
| 2019/0042362 A1* | 2/2019 | Bolotov | H03M 13/1102 |
| 2019/0303253 A1* | 10/2019 | Shin | G11C 29/022 |
| 2019/0347158 A1* | 11/2019 | Chung | G06F 11/1048 |
| 2019/0354436 A1* | 11/2019 | Chung | G06F 11/1076 |
| 2019/0391755 A1* | 12/2019 | Lee | G06F 3/0679 |
| 2020/0104208 A1* | 4/2020 | Heo | G06F 3/0679 |

* cited by examiner

MEMORY SYSTEM AND OPERATION METHOD THEREOF

CROSS-REFERENCE TO RELATED APPLICATION

This application claims priority under 35 U.S.C. § 119 to Korean Patent Application No. 10-2019-0009054, filed on Jan. 24, 2019, which is incorporated herein by reference in its entirety.

BACKGROUND

1. Field

This patent document relates to error detection and correction in the context of a memory system.

2. Discussion of the Related Art

In the beginning of the semiconductor memory device industry, a number of original good dies with no defective memory cells present in a memory chip passed through a semiconductor fabrication process. The good dies were spread over a wafer. However, the gradual increase in capacities of memory devices has made it difficult to fabricate a memory device having no defective memory cells. At present, it seems very unlikely that such a defect-free memory device will be fabricated in the near future. As one measure for overcoming such a situation, a method for repairing defective memory cells of a memory device with redundancy memory cells is used.

As another measure, an error correction code (ECC) circuit is used to detect and correct an error which occurs in a memory cell and an error which occurs while data are transferred during read and write operations of a memory system.

Recently, as a modern memory system grows more complex, a memory controller of such system also performs various processes on addresses and data, which may lead to additional errors. Thus, there is a demand for a technique for detecting and correcting errors that occur in the memory controller as well as in the memory of the memory system.

SUMMARY

Various embodiments are directed to a memory system capable of improving error detection and error correction efficiency of the memory system, and a method of operating such a memory system.

In an embodiment, a memory system may include: a first error detection circuit suitable for generating a first error detection code using host data and a host address which are transferred from a host; a second error detection circuit suitable for generating a second error detection code using system data including one or more host data, a logical address corresponding to one or more host addresses, a physical address corresponding to the logical address and one or more first error detection codes; a third error detection code suitable for generating a third error detection code using the system data, the one or more first error detection codes and the second error detection code; and a first memory suitable for storing the system data, the one or more first error detection codes, the second error detection code and the third error detection code.

In an embodiment, a memory system may include: an error detection circuit suitable for generating an error detection code using an address and data during a write operation; and a memory suitable for storing the data and the error detection code during the write operation.

In an embodiment, an operation method of a memory system may include: receiving write data and a write address; generating an error detection code using the write data and the write address; and writing the write data and the error detection code to a region selected by the write address in a memory.

DETAILED DESCRIPTION

Various embodiments of the present invention are described below in more detail with reference to the accompanying drawings. The present invention may, however, be embodied in other forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to the same embodiment, and different references to any such phrase are not necessarily to the same embodiment(s).

Figure 1:
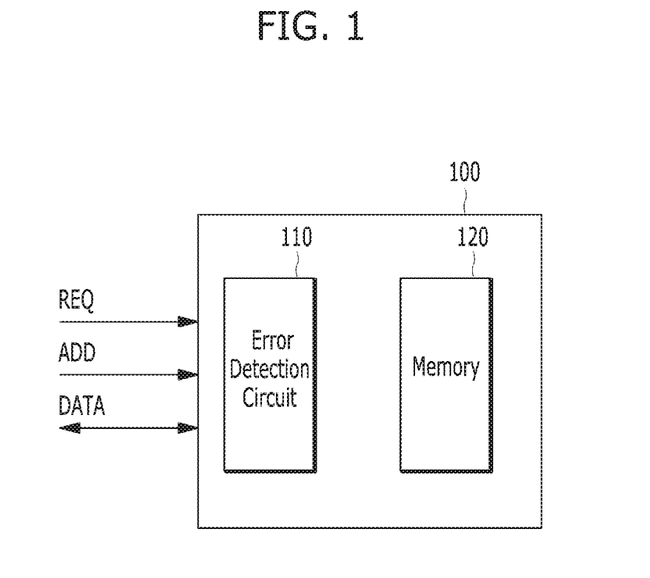
FIG. 1 is a diagram illustrating a memory system in accordance with an embodiment.

FIG. 1 is a diagram illustrating a memory system 100 in accordance with an embodiment.

Referring to FIG. 1, the memory system 100 may include an error detection circuit 110 and a memory 120. It is noted that FIG. 1 illustrates only a portion of the memory system 100, which is directly related to error detection. Those skilled in the art will understand that the memory system 100 includes other components.

During a write operation, an address ADD and data DATA with a write request REQ may be transferred to the memory system 100 from a host.

Figure 2:
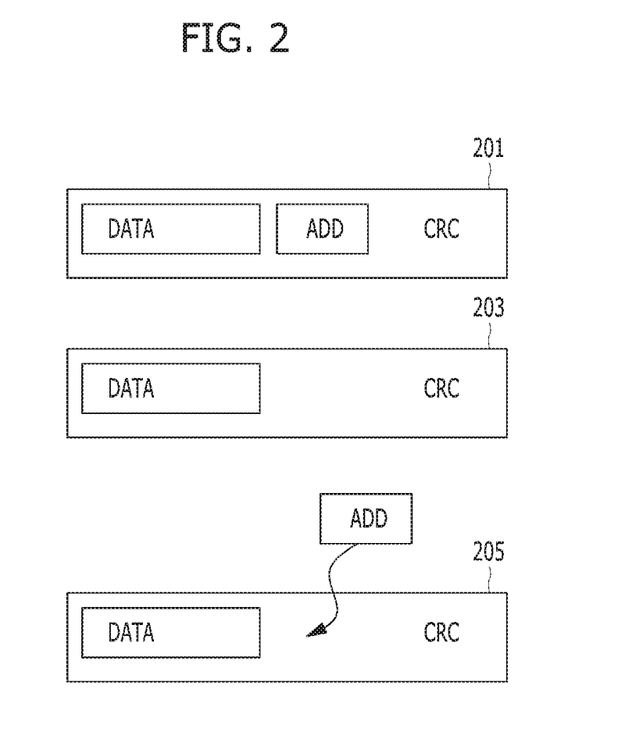
FIG. 2 is a diagram illustrating an operation of a memory system in accordance with an embodiment.

During the write operation, the error detection circuit 110 may generate an error detection code CRC using the data DATA and the address ADD which are transferred from the host. In the present embodiment, although a cyclic redundancy check (CRC) code is exemplified as the error detection code CRC, codes based on algorithms other than the CRC may also be used. In FIG. 2, reference numeral 201 may represent the data DATA, the address ADD and the error detection code CRC which is generated by using the data DATA and the address ADD. The information represented by reference numeral 201 of FIG. 2, in which the data DATA and the address ADD are included in a box represented by CRC, may indicate that the data DATA and the address ADD are covered by the error detection code CRC.

During the write operation, the data DATA and the error detection code CRC may be written to a region selected by the address ADD in the memory 120. In FIG. 2, reference numeral 203 may represent the data DATA and the error detection code CRC which are stored in the memory 120. Reference numeral 203 of FIG. 2 may indicate that the address ADD is excluded from the information represented by reference numeral 201.

During a read operation, the address ADD with a read request REQ may be transferred to the memory system 100 from the host.

During the read operation, the data DATA and the error detection code CRC may be read from the region selected by the address ADD in the memory 120. In FIG. 2, reference numeral 205 may represent that the address ADD transferred from the host is added to the data DATA and the error detection code CRC which are read from the memory 120.

During the read operation, the error detection circuit 110 may add the address ADD transferred from the host to the data DATA and the error detection code CRC which are read from the memory 120, and detect errors of the read data DATA and the address ADD transferred from the host, using the error detection code CRC. When the error detection code CRC includes information enough to correct the detected errors as well as information for detecting the errors, the error detection circuit 110 may also perform an operation of correcting the detected errors.

The data DATA read from the memory 120 included in the memory system 100 may be transferred to the host. Furthermore, when an error is detected by the error detection circuit 110, the error detection ERR may be reported to the host.

The memory system 100 of FIG. 1 may detect an error of the address ADD as well as the data DATA because the address ADD as well as the data DATA is covered by the error detection code CRC. Furthermore, since the address ADD is not stored in the memory 120 while the address ADD is covered by the error detection code CRC, the capacity waste of the memory 120 may be prevented.

The memory system 100 of FIG. 1 may be implemented with one or more integrated circuit chips. For example, the memory system 100 may implemented with one chip such that the error detection circuit 110 and the memory 120 are included in the one chip, or the memory system 100 may implemented with two or more chips such that the error detection circuit 110 is included in a memory controller chip, and the memory 120 is included in a memory chip.

Figure 3:
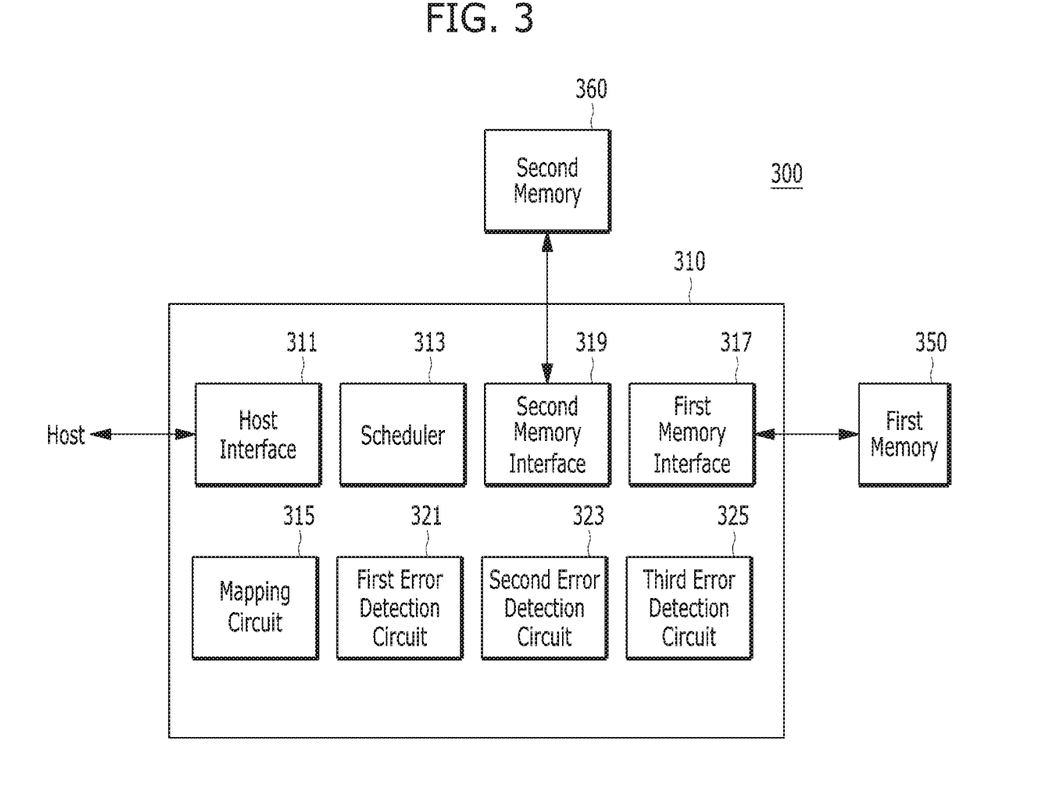
FIG. 3 is a diagram illustrating a memory system in accordance with an embodiment.

FIG. 3 is a configuration diagram illustrating a memory system 300 in accordance with an embodiment.

Referring to FIG. 3, the memory system 300 may include a memory controller 310, a first memory 350 and a second memory 360.

The memory controller 310 may control read and write operations of the first memory 350 according to a request of a host.

The memory controller 310 may include a host interface 311, a scheduler 313, a mapping circuit 315, a first memory interface 317, a second memory interface 319, a first error detection circuit 321, a second error detection circuit 323 and a third error detection circuit 325.

The host interface 311 may serve as an interface between the memory controller 310 and the host. Through the host interface 311, requests of the host and addresses and data corresponding to the requests may be received, and processing results of the requests may be transmitted to the host.

The host interface may be one of various types of interfaces such as PCIe (PCI-EXPRESS), CCIX (Cache Coherent Interconnect for Accelerators) and DIMM (Dual In-Line Memory Module).

The scheduler 313 may perform scheduling to raise the performance of the memory system 300. For example, the scheduler 313 may determine the order of requests to be processed by the first memory 350, among the requests received from the host. If necessary, the scheduler 313 may schedule operations of the first memory 350 in a different order from the order in which the requests are received from the host, in order to improve the performance of the memory system 300. For example, although the host requested a read operation before a write operation, the scheduler 313 may adjust the order of the operations such that the write operation is performed before the read operation.

The mapping circuit 315 may perform a mapping operation between data of the host and data to be stored in the first memory 350. The size of a data chuck or page of the host may be different from the size of a data chunk or page of the first memory 350. For example, the host may transmit/receive 512-bit data whenever one read or write operation is performed, and the first memory 350 may transmit/receive 1024-bit data whenever one read or write operation is performed. The mapping circuit 315 may perform a mapping operation between two data chunks of the host side and one data chunk of the first memory side. Furthermore, the mapping circuit 315 may perform a mapping operation between a logical address and a physical address for wear-leveling or the like.

The first memory interface 317 may serve as an interface for communication between the memory controller 310 and the first memory 350, and the second memory interface 319 may serve as an interface for communication between the memory controller 310 and the second memory 360.

The first to third error detection circuits 321, 323 and 325 may generate error detection codes during a write operation, and detect an error using the error detection codes during a read operation. Ranges covered by the first to third error detection circuits 321, 323 and 325 may be different from one another, and the first to third error detection circuits 321, 323 and 325 will be described below in detail with reference to FIGS. 4 and 5.

The first memory 350 may serve as a memory for storing write data provided by the host during a write operation, and providing data stored therein as read data during a read operation. The first memory 350 may be one of various types of memories such as a PCRAM, NAND Flash, STT-MRAM and DRAM.

The second memory 360 may serve as a memory for storing a mapping table between a logical address and a physical address. Since the second memory 360 is a memory for storing the mapping table, the second memory 360 may have a smaller capacity than the first memory 350. For example, when the first memory 350 is a large-capacity PCRAM, the second memory 360 may be a DRAM having a smaller capacity than the first memory.

Figure 4:
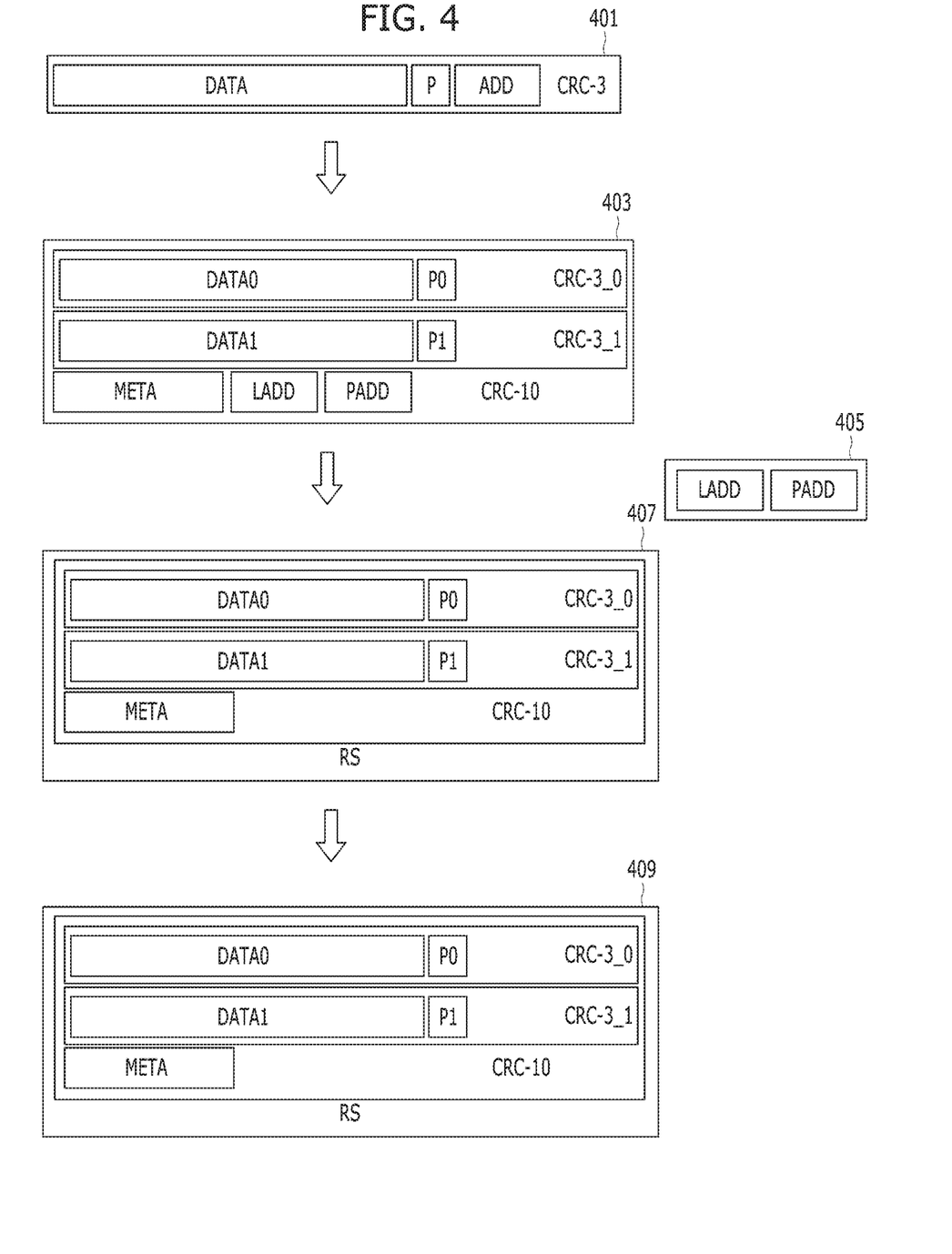
FIG. 4 is a diagram illustrating a write operation of a memory system in accordance with an embodiment.

FIG. 4 is a diagram for describing a write operation of the memory system 300.

Reference numeral 401 of FIG. 4 may represent that the first error detection circuit 321 generates a first error detection code CRC-3 using host data DATA, a poison bit P and a host address ADD which are transferred from the host. That is, the first error detection code CRC-3 may be generated by using the host data DATA, the poison bit P and the host address ADD as a message. The host data DATA may have 512 bits. The poison bit P may be a bit that the host uses to indicate the reliability of the data DATA. For example, when the data DATA is highly likely to contain an error, the host may indicate the likelihood using the poison bit P. The host address ADD may have 40 bits. The first error detection code CRC-3 may be an error detection code that the first error detection circuit 321 generates using the host data DATA, the poison bit P and the host address ADD. In the present embodiment, a CRC-3 code may be exemplified as the first error detection code CRC-3. In this case, the first error detection code CRC-3 may have three bits. The information represented by reference numeral 401, in which the data DATA, the poison bit P and the address ADD are included in a box represented by CRC-3, may indicate that the data DATA, the poison bit P and the address ADD are covered by the first error detection code CRC-3.

Reference numeral 403 of FIG. 4 may represent that the second error detection circuit 323 generates a second error detection code CRC-10 using system data DATA0 and DATA1, poison bits P0 and P1, first error detection codes CRC-3_0 and CRC-3_1, a logical address LADD, a physical address PADD and meta data META. The system data DATA0 and DATA1 may indicate data including two host data. Since the present embodiment exemplifies that the chunk size of the first memory 350 is twice larger than the chuck size of the host, two host data may be included in the system data DATA0 and DATA1. However, the number of host data included in the system data DATA0 and DATA1 may be changed depending on the chunk sizes of the host and the first memory 350. Since the present embodiment exemplifies that the system data DATA0 and DATA1 include two host data, the system data may have 1024 bits. The system data DATA0 and DATA1 and the host data may be mapped by the mapping circuit 315.

The poison bits P0 and P1 may be poison bits which correspond to the two host data included in the system data DATA0 and DATA1, respectively. The first error detection codes CRC-3_0 and CRC-3_1 may be error detection codes which correspond to the two host data included in the system data DATA0 and DATA1, respectively. The logical address LADD may be a logical address corresponding to the system data DATA0 and DATA1. The logical address LADD may be generated by the mapping circuit 315 using the host address ADD. Since the logical address LADD corresponds to data twice larger than the host address ADD, the logical address LADD may have 39 bits less by one bit than the host address ADD. The physical address PADD may be a physical address corresponding to the logical address. For a wear-leveling operation or the like, an address mapping operation between the logical address LADD and the physical address PADD may be performed. The physical address PADD may have a larger number of bits than the logical address LADD. For example, the physical address PADD may have 40 bits. This is because the number of regions corresponding to the physical address PADD needs to be larger than the number of regions corresponding to the logical address LADD, for a wear leveling operation, a bad block management operation and the like. The meta data META may be data which are operated for management of the first memory 350. The meta data META may include write counter information, wear leveling pending bit information and write disturbance pending bit information for managing wear leveling, write disturbance and the like. The meta data META may have 27 bits, for example.

The second error detection code CRC-10 may be an error detection code that the second error detection circuit 323 generates using the system data DATA0 and DATA1, the poison bits P0 and P1, the first error detection codes CRC-3_0 and CRC-3_1, the logical address LADD, the physical address PADD and the meta data META. That is, the second error detection code CRC-10 may be generated by using the system data DATA0 and DATA1, the poison bits P0 and P1, the first error detection codes CRC-3_0 and CRC-3_1, the logical address LADD, the physical address PADD and the meta data META as a message. In the present embodiment, a CRC-10 code may be exemplified as the second error detection code CRC-10. In this case, the second error detection code CRC-10 may have 10 bits. The system data DATA0 and DATA1, the poison bits P0 and P1, the first error detection codes CRC-3_0 and CRC-3_1, the logical address LADD, the physical address PADD and the meta data META, which are included in a box represented by CRC-10 in the information represented by reference numeral 403, may be covered by the second error detection code CRC-10. Reference numeral 403 may represent that the host address ADD which was present in the information represented by reference numeral 401 is excluded from the target covered by the second error detection code CRC-10, i.e. the message.

Reference numeral 405 of FIG. 4 may represent information stored in the second memory 360. The second memory 360 may store the mapping table indicating a mapping relationship between the logical address LADD and the physical address PADD.

Reference numeral 407 of FIG. 4 may represent that the third error detection circuit 325 generates a third error detection code RS using the system data DATA0 and DATA1, the poison bits P0 and P1, the first error detection codes CRC-3_0 and CRC-3_1, the meta data META and the second error detection code CRC-10. That is, the third error detection code RS may be generated by using the system data DATA0 and DATA1, the poison bits P0 and P1, the first error detection codes CRC-3_0 and CRC-3_1, the meta data META and the second error detection code CRC-10 as a message. Reference numeral 407 may represent that the logical address LADD and the physical address PADD are removed from the message of the third error detection code RS. In the present embodiment, a Reed-Solomon (RS) code may be exemplified as the third error detection code CRC-10. In this case, the third error detection code RS may have 320 bits. The system data DATA0 and DATA1, the poison bits P0 and P1, the first error detection codes CRC-3_0 and CRC-3_1, the meta data META and the second error detection code CRC-10, which are included in a box represented by RS, may be covered by the third error detection code RS.

Reference numeral 409 of FIG. 4 may represent information stored in the first memory 350. Reference numeral 409 of FIG. 4 may represent the same information as reference numeral 407. That is, both of the third error detection code RS and the message of the third error detection code RS may be stored in the first memory 350.

Figure 5:
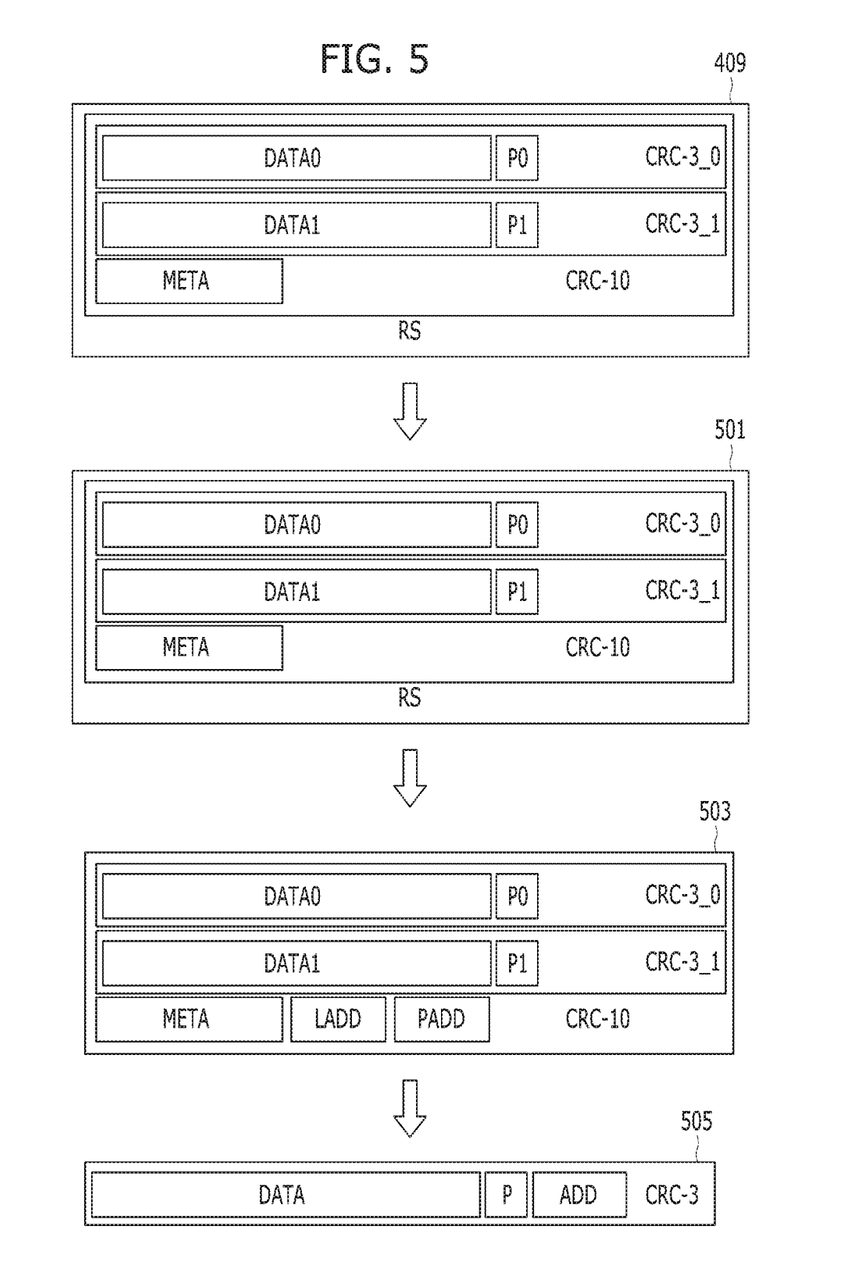
FIG. 5 is a diagram illustrating a read operation of a memory system in accordance with an embodiment.

FIG. 5 is a diagram for describing a read operation of the memory system 300.

Reference numeral 409 of FIG. 5 may represent information stored in the first memory 350. The information 409 stored in the first memory 350 may be read and transferred to the third error detection circuit 325.

In order to access the first memory 350, a physical address PADD may be used. The physical address PADD may be generated through a process in which the mapping circuit 315 generates a logical address LADD using an address ADD transferred from the host with a read request, and maps the logical address LADD to the physical address PADD using the mapping table stored in the second memory 360.

Reference numeral 501 of FIG. 5 may represent information that the third error detection circuit 325 receives from the first memory 350. The third error detection circuit 325 may detect errors of the system data DATA0 and DATA1, the poison bits P0 and P1, the first error detection codes CRC-3_0 and CRC-3_1, the meta data META and the second error detection code CRC-10 using the third error detection code RS included in the information 501, and correct the detected errors. The third error detection circuit 325 may transfer the system data DATA0 and DATA1, the poison bits P0 and P1, the first error detection codes CRC-3_0 and CRC-3_1, the meta data META and the second error detection code CRC-10, of which the errors are corrected, to the second error detection circuit 323.

Reference numeral 503 of FIG. 5 may represent information that the second error detection circuit 323 receives from the third error detection circuit 325 and the mapping circuit 315. The second error detection circuit 323 may receive the system data DATA0 and DATA1, the poison bits P0 and P1, the first error detection codes CRC-3_0 and CRC-3_1, the meta data META and the second error detection code CRC-10 from the third error detection circuit 325, and receive the logical address LADD and the physical address PADD from the mapping circuit 315. The second error detection circuit 323 may detect errors of the system data DATA0 and DATA1, the poison bits P0 and P1, the first error detection codes CRC-3_0 and CRC-3_1, the meta data META, the logical address LADD and the physical address PADD using the second error detection code CRC-10. When the errors are detected, the second error detection circuit 323 may inform the host that the errors are detected, through the host interface 311. The present embodiment may exemplify that the second error detection code CRC-10 includes information for detecting an error. However, when the second error detection code CRC-10 includes information for correcting a detected error as well as the information for detecting an error, the second error detection circuit 323 may correct the detected error. The second error detection circuit 323 may transfer a part of the system data DATA0 and DATA1, a part of the poison bits P0 and P1 and a part of the first error detection codes CRC-3_0 and CRC-3_1 to the first error detection circuit 321. The parts of the system data DATA0 and DATA1, the poison bits P0 and P1 and the first error detection codes CRC-3_0 and CRC-3_1 may indicate parts corresponding to the host address ADD among the system data DATA0 and DATA1, the poison bits P0 and P1 and the first error detection codes CRC-3_0 and CRC-3_1.

Reference numeral 505 of FIG. 5 may represent the information DATA, P and CRC-3 that the first error detection circuit 321 receives from the second error detection circuit 323 and the host address ADD that the first error detection circuit 321 receives from the host. The first error detection circuit 321 may detect errors of the data DATA, the poison bit P and the host address ADD using the first error detection code CRC-3. When the errors are detected, the first error detection circuit 321 may inform the host that the errors are detected, through the host interface 311. The present embodiment may exemplify that the first error detection code CRC-3 includes information for detecting an error. However, when the first error detection code CRC-3 includes information for correcting a detected error as well as the information for detecting an error, the first error detection circuit 321 may correct the detected error. After the error is detected by the first error detection circuit 321, the data DATA and the poison bit P may be transferred to the host through the host interface 311.

Referring to FIGS. 3 to 5, the first error detection circuit 321 may encode/decode the first error detection code CRC-3 at the point where the data DATA, the poison bit P and the address ADD are transferred to the memory controller from the host. Therefore, the first error detection circuit 321 may detect errors of the data DATA, the poison bit P and the address ADD, which occur throughout the memory system.

The second error detection circuit 323 may encode/decode the second error detection code CRC-10 for detecting errors of the system data DATA0 and DATA1, the poison bits P0 and P1, the first error detection codes CRC-3_0 and CRC-3_1, the meta data META, the logical address LADD and the physical address PADD. Therefore, the second error detection circuit 323 may detect not only an error which occurs in the first memory 350, but also an error which occurs in the second memory 360.

The third error detection circuit 325 may perform an operation of detecting and correcting errors of the information DATA0, DATA1, P0, P1, CRC-3_0, CRC-3_1, META and CRC-10 stored in the first memory 350. Therefore, an error which occurs in the first memory 350 may be reliably detected and corrected.

Although the first and second error detection circuits 321 and 323 include the addresses ADD<LADD and PADD in the error detection target, such addresses may not be stored in the first memory 350, which makes it possible to prevent capacity waste of the first memory 350.

Figure 6:
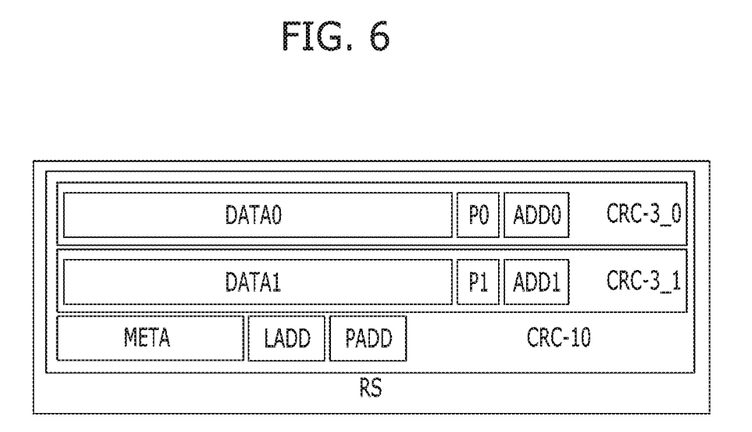
FIG. 6 is a diagram illustrating information protected by codes CRC-3, CRC-10 and RS in accordance with an embodiment.

FIG. 6 is a diagram illustrating information protected by the codes CRC-3, CRC-10 and RS.

FIG. 6 illustrates that the system data DATA0 and DATA1, the poison bits P0 and P1 and addresses ADD0 and ADD1 are protected by the first error detection codes CRC-3_0 and CRC-3_1. Therefore, the system data DATA0 and DATA1, the poison bits P0 and P1 and the addresses ADD0 and ADD1 which are transferred to the memory controller 310 from the host may be protected, and errors of the system data DATA0 and DATA1 and the poison bits P0 and P1 which are transferred to the host from the memory controller 310 may be detected and corrected.

The information which has been protected by the first error detection codes CRC-3_0 and CRC-3_1 may be redundantly protected by the second error detection code CRC-10. In addition, the information such as the meta data META, the logical address LADD and the physical address PADD, which the memory controller 310 additionally uses to process data and addresses of the memory system 300, may be further protected.

The information which has been protected by the first error detection codes CRC-3_0 and CRC-3_1 and the second error detection code CRC-10 may be redundantly protected by the third error detection code RS, and an error which occurs during the process in which the information is inputted to/outputted from the first memory 350 and the process in which the information is stored in the first memory 350 may be detected and corrected by the third error detection code RS.

Since the information processed by the memory controller 310, the first memory 350 and the second memory 360 of the memory system 300 is redundantly protected by the three kinds of codes CRC-3_0, CRC-3_1, CRC-10 and RS, an error which is not detected or corrected by one code may be detected and corrected by another code. For example, an error which occurred in the first memory 350 and is not corrected by the third error detection code RS may be corrected by the second error detection code CRC-10. Furthermore, since the three kinds of codes CRC-3_0, CRC-3_1, CRC-10 and RS cover errors in different ranges which overlap one another, an error can be detected and corrected even though the error occurs at any position of the memory system 300.

In accordance with various embodiments, the error detection and error correction efficiency of the memory system can be improved.

Although various embodiments have been illustrated and described, it will be apparent to those skilled in the art in light of the present disclosure that various changes and modifications may be made without departing from the spirit and scope of the invention as defined in the following claims.

What is claimed is:

1. A memory system comprising:
a first error detection circuit configured to generate a first error detection code using host data and a host address which are transferred from a host;
a second error detection circuit configured to generate a second error detection code using system data including the host data, a logical address corresponding to the host address, a physical address corresponding to the logical address and the first error detection code;
a third error detection circuit configured to generate a third error detection code using the system data, the first error detection code and the second error detection code; and
a first memory configured to store the system data, the first error detection code, the second error detection code and the third error detection code.

2. The memory system of claim 1, further comprising a second memory configured to store a mapping table between the logical address and the physical address.

3. The memory system of claim 1, wherein the first error detection circuit generates the first error detection code by further using a poison bit,
the second error detection circuit generates the second error detection code by further using the poison bit,
the third error detection circuit generates the third error detection code by further using the poison bit, and
the first memory further stores the poison bit.

4. The memory system of claim 3, wherein the second error detection circuit generates the second error detection code by further using meta data,
the third error detection circuit generates the third error detection code by further using the meta data, and
the first memory further stores the meta data.

5. The memory system of claim 1, wherein the third error detection code comprises information for detecting errors of the system data, the first error detection code and the second error detection code and correcting the detected errors.

6. The memory system of claim 1, wherein the first error detection code is a cyclic redundancy check (CRC) code,
the second error detection code is a CRC code, and
the third error detection code is a Reed-Solomon (RS) code.

7. The memory system of claim 1, wherein the third error detection circuit detects errors of the system data, the first error detection code and the second error detection code, which are read from the first memory, using the third error detection code read from the first memory.

8. The memory system of claim 1, wherein the second error detection circuit detects errors of the system data and the first error detection code, which are read from the first memory, and errors of the logical address and the physical address, which are generated through the host address transferred from the host, using the second error detection code read from the first memory.

9. The memory system of claim 1, wherein the first error detection circuit detects errors of the host data included in the system data read from the first memory and the host address transferred from the host, using the first error detection code read from the first memory.

10. A memory system comprising:
a first error detection circuit configured to generate a first-first error detection code using first host data and a first host address which are transferred from a host and generate a second-first error detection code using second host data and a second host address which are transferred from the host;
a second error detection circuit configured to generate a second error detection code using system data including the first and second host data, a logical address corresponding to the first and second host addresses, a physical address corresponding to the logical address and the first-first and second-first error detection codes;
a third error detection circuit configured to generate a third error detection code using the system data, the first-first and second-first error detection codes and the second error detection code; and
a first memory configured to store the system data, the first-first and second-first error detection codes, the second error detection code and the third error detection code.

11. The memory system of claim 10, further comprising a second memory configured to store a mapping table between the logical address and the physical address.

12. The memory system of claim 10, wherein the first error detection circuit generates the first-first error detection code by further using a first poison bit and generated the second-first error detection code by further using a second poison bit,
the second error detection circuit generates the second error detection code by further using the first and second poison bits,
the third error detection circuit generates the third error detection code by further using the first and second poison bits, and
the first memory further stores the first and second poison bits.

13. The memory system of claim 12, wherein the second error detection circuit generates the second error detection code by further using meta data,
the third error detection circuit generates the third error detection code by further using the meta data, and
the first memory further stores the meta data.

14. The memory system of claim 10, wherein the third error detection code comprises information for detecting errors of the system data, the first-first and second-first error detection codes and the second error detection code and correcting the detected errors.

15. The memory system of claim 10, wherein each of the first-first and second-first error detection codes is a cyclic redundancy check (CRC) code,
the second error detection code is a CRC code, and
the third error detection code is a Reed-Solomon (RS) code.

16. The memory system of claim 10, wherein the third error detection circuit detects errors of the system data, the first-first and second-first detection codes and the second error detection code, which are read from the first memory, using the third error detection code read from the first memory.

17. The memory system of claim 10, wherein the second error detection circuit detects errors of the system data and the first-first and second-first error detection codes, which are read from the first memory, and errors of the logical address and the physical address, which are generated through the first and second host addresses transferred from the host, using the second error detection code read from the first memory.

18. The memory system of claim 10, wherein the first error detection circuit detects errors of the first host data read from the first memory and the first host address transferred from the host, using the first-first error detection code read from the first memory and detects errors of the second host data read from the first memory and the second host address transferred from the host, using the second-first error detection code read from the first memory.

* * * * *